United States Patent
Li et al.

(10) Patent No.: US 12,311,494 B2
(45) Date of Patent: May 27, 2025

(54) PRESSURE SIGNALS DURING MOTOR TORQUE MONITORING TO PROVIDE SPATIAL RESOLUTION

(71) Applicant: Applied Materials, Inc., Santa Clara, CA (US)

(72) Inventors: Thomas Li, Santa Clara, CA (US); Benjamin Cherian, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 397 days.

(21) Appl. No.: 17/677,893

(22) Filed: Feb. 22, 2022

(65) Prior Publication Data

US 2022/0281059 A1 Sep. 8, 2022

Related U.S. Application Data

(60) Provisional application No. 63/155,917, filed on Mar. 3, 2021.

(51) Int. Cl.
*B24B 49/16* (2006.01)
*B24B 37/013* (2012.01)
(Continued)

(52) U.S. Cl.
CPC .......... *B24B 37/013* (2013.01); *B24B 37/042* (2013.01); *H01L 22/26* (2013.01)

(58) Field of Classification Search
CPC ...... B24B 37/013; B24B 37/042; H01L 22/26
See application file for complete search history.

(56) References Cited

U.S. PATENT DOCUMENTS 6,129,610 A * 10/2000 Stephens ................. B24B 49/16
451/36
6,431,953 B1 * 8/2002 Carter ..................... B24B 49/12
451/60

(Continued)

FOREIGN PATENT DOCUMENTS

CN 102390036 3/2012
CN 102490112 6/2012
(Continued)

OTHER PUBLICATIONS

International Search Report and Written Opinion in International Appln. No. PCT/US2022/017266, dated Jun. 2, 2022, 11 pages.
(Continued)

*Primary Examiner* — Laura M Menz
(74) *Attorney, Agent, or Firm* — Fish & Richardson P.C.

(57) ABSTRACT

A method of polishing includes holding a substrate with a carrier head against a polishing surface of a polishing pad, generating relative motion between the substrate and polishing pad, applying a first pressure modulated by a first modulation function to a first region of the substrate, applying a second pressure modulated by a second modulation function that is orthogonal to the first modulation function to a second region of the substrate, during polishing of the substrate monitoring the substrate with an in-situ friction monitoring system to generate a sequence of measured values, and determining a relative contribution to the sequence of measured value from the first region and second region based on distinguishing the first frequency from the second frequency.

12 Claims, 5 Drawing Sheets

(51) Int. Cl.
  *B24B 37/04* (2012.01)
  *H01L 21/66* (2006.01)

(56) References Cited

U.S. PATENT DOCUMENTS

| | | | | |
|---|---|---|---|---|
| 6,664,557 B1 * | 12/2003 | Amartur | ............... | B24B 37/013 451/6 |
| 6,991,514 B1 * | 1/2006 | Meloni | ................. | B24B 37/013 451/6 |
| 7,160,178 B2 * | 1/2007 | Gagliardi | ............. | B24B 53/017 451/313 |
| 8,554,356 B2 * | 10/2013 | Shimizu | ................. | B24B 49/12 451/6 |
| 8,563,335 B1 * | 10/2013 | Benvegnu | ............... | H01L 22/12 438/692 |
| 8,992,286 B2 * | 3/2015 | Cherian | ................ | B24B 37/013 451/6 |
| 9,266,214 B2 * | 2/2016 | Kimba | ................. | B24B 37/013 451/6 |
| 10,493,590 B2 | 12/2019 | Zhang et al. | | |
| 11,919,121 B2 * | 3/2024 | Cherian | ................ | B24B 37/005 |
| 11,969,854 B2 * | 4/2024 | Cherian | ................ | B24B 37/005 |
| 11,980,995 B2 * | 5/2024 | Li | ........................... | B24B 37/24 |
| 2002/0090889 A1 * | 7/2002 | Crevasse | ............... | B24B 37/013 451/41 |
| 2005/0260922 A1 * | 11/2005 | Gan | ........................ | B24B 49/16 451/5 |
| 2007/0042675 A1 * | 2/2007 | Benvegnu | ........... | H01L 21/3212 451/6 |
| 2007/0087662 A1 * | 4/2007 | Benvegnu | ............... | B24B 49/16 700/121 |
| 2007/0224915 A1 * | 9/2007 | David | ................... | B24B 37/013 451/6 |
| 2008/0099443 A1 * | 5/2008 | Benvegnu | ................ | B24D 7/12 700/121 |
| 2008/0274670 A1 * | 11/2008 | Tada | ........................ | B24B 49/12 451/6 |
| 2011/0124269 A1 * | 5/2011 | Tada | ..................... | B24B 49/105 451/5 |
| 2011/0281501 A1 * | 11/2011 | Qian | ...................... | B24B 49/12 451/6 |
| 2013/0052916 A1 | 2/2013 | David et al. | | |
| 2013/0280827 A1 * | 10/2013 | Benvegnu | ............... | H01L 22/26 257/E21.53 |
| 2013/0288572 A1 * | 10/2013 | Benvegnu | ............. | B24B 37/013 451/5 |
| 2016/0013085 A1 | 1/2016 | Chew et al. | | |
| 2019/0168355 A1 | 6/2019 | Suzuki et al. | | |
| 2019/0275633 A1 | 9/2019 | Dhandapani | | |
| 2019/0283208 A1 * | 9/2019 | Dhandapani | ............ | B24B 37/04 |
| 2021/0170542 A1 * | 6/2021 | Sakashita | ............ | H01L 21/3212 |
| 2022/0161388 A1 * | 5/2022 | Nakano | ................. | B24B 37/102 |
| 2022/0281059 A1 * | 9/2022 | Li | ......................... | B24B 37/042 |
| 2022/0281060 A1 * | 9/2022 | Li | ......................... | B24B 37/042 |
| 2022/0281066 A1 * | 9/2022 | Li | ........................... | B24B 37/24 |
| 2023/0390886 A1 * | 12/2023 | Ummethala | ............ | H01L 22/26 |

FOREIGN PATENT DOCUMENTS

| | | | | |
|---|---|---|---|---|
| CN | 108290269 A * | 7/2018 | .......... | B24B 37/013 |
| CN | 117083152 A * | 11/2023 | .......... | B24B 37/013 |
| JP | 2002103203 A * | 4/2002 | | |
| JP | 2005-501410 | 1/2005 | | |
| JP | 2009-028856 A | 2/2009 | | |
| JP | 2018-508123 A | 3/2018 | | |
| JP | 2023127050 A * | 9/2023 | | |
| KR | 10-2017-0071609 | 6/2017 | | |
| KR | 10-2019-0066590 | 6/2019 | | |
| KR | 10-2019-0129307 | 11/2019 | | |
| TW | 200520893 | 7/2005 | | |
| TW | 200524709 | 8/2005 | | |
| TW | 201236812 | 9/2012 | | |
| WO | WO-2019177840 A1 * | 9/2019 | .......... | B24B 37/005 |
| WO | WO-2022186993 A1 * | 9/2022 | .......... | B24B 37/013 |
| WO | WO-2022187025 A1 * | 9/2022 | .......... | B24B 37/013 |
| WO | WO-2023166986 A1 * | 9/2023 | ............ | B24B 21/08 |
| WO | WO-2023167001 A1 * | 9/2023 | | |

OTHER PUBLICATIONS

Office Action in Korean Appln. No. 10-2023-7033221, dated Aug. 29, 2024, 18 pages (with English summary).

Fukuroda et al., "In-Situ CMP Monitoring Technique for Multi-Layer Interconnection", Presented at Proceedings of International Electron Devices Meeting, Washington, DC, USA, Dec. 10-13, 1995; IEEE, Aug. 6, 2002, 4 pages.

Hetherington et al., "Analysis of In-Situ Vibration Monitoring for End-Point Detection of CMP Planarization Processes," Presented at Proceedings of the Conference: SPIE Symposium on Microelectronics Manufacturing Technologies, Edinburgh, Scotland, May 19-21, 1999; USDOE, May 14, 1999, 13 pages.

Office Action in Japanese Appln. No. 2023-553454, dated Nov. 5, 2024, 8 pages (with English translation).

* cited by examiner

PRESSURE SIGNALS DURING MOTOR TORQUE MONITORING TO PROVIDE SPATIAL RESOLUTION

CROSS-REFERENCE TO RELATED APPLICATIONS

This application claims priority to U.S. Provisional Application Ser. No. 63/155,917, filed on Mar. 3, 2021, the disclosure of which is incorporated by reference.

TECHNICAL FIELD

This disclosure relates to using monitoring of motor torque or motor current during chemical mechanical polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the metallic layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry distribution, the polishing pad condition, the relative speed between the polishing pad and the substrate, and the load on the substrate can cause variations in the material removal rate. These variations, as well as variations in the initial thickness of the substrate layer, cause variations in the time needed to reach the polishing endpoint. Therefore, the polishing endpoint usually cannot be determined merely as a function of polishing time. In some systems, the substrate is monitored in-situ during polishing, e.g., by monitoring the torque or current required by a motor to rotate the platen or carrier head.

SUMMARY

In one aspect, a method of polishing includes holding a substrate with a carrier head against a polishing surface of a polishing pad, generating relative motion between the substrate and polishing pad, applying a first pressure modulated by a first modulation function to a first region of the substrate, applying a second pressure modulated by a second modulation function that is orthogonal to the first modulation function to a second region of the substrate, during polishing of the substrate monitoring the substrate with an in-situ friction monitoring system to generate a sequence of measured values, and determining a relative contribution to the sequence of measured value from the first region and second region based on distinguishing the first frequency from the second frequency.

In another aspect, a non-transitory computer-readable medium has stored thereon instructions to be executed by one or more computers to perform operations in the above method.

In another aspect, a polishing system includes a platen to support a polishing pad, a carrier head to hold a substrate against the polishing pad with the carrier head configured to apply independently adjustable pressures to a plurality of different regions of the substrate, a motor to generate relative motion between the carrier head and the platen, an in-situ friction monitoring system to generate a sequence of values, and a controller configured to perform operations in the above method.

Implementations can include one or more of the following potential advantages. Spatial information concerning the relative coefficient of friction of the substrate on the polishing pad can be extracted from the motor torque signal. Polishing can be halted more reliably for the entire substrate at exposure of an underlying layer. Polishing uniformity can be increased, and both dishing and residue can be reduced.

The details of one or more embodiments are set forth in the accompanying drawings and the description below. Other aspects, features and advantages will be apparent from the description and drawings, and from the claims.

BRIEF DESCRIPTION OF DRAWINGS

Like reference symbols in the various drawings indicate like elements.

DETAILED DESCRIPTION

In some semiconductor chip fabrication processes an overlying layer, e.g., silicon oxide or polysilicon, is polished until an underlying layer, e.g., a dielectric, such as silicon oxide, silicon nitride or a high-K dielectric, is exposed. For many applications, the underlying layer has a different coefficient of friction against the polishing layer than the overlying layer. As a result, when the underlying layer is exposed, the torque required by a motor to cause the platen or carrier head to rotate at a specified rotation rate changes. The polishing endpoint can be determined by detecting this change in motor torque. Motor torque can be measured by measuring the motor's power consumption, e.g., by measuring motor current if voltage is held constant, or by receiving a value reported by a motor driver.

Most polishing processes result in different polishing rates across the substrate, so that the underlying layer is cleared at the substrate edges before the center, or vice versa. Unfortunately, in conventional motor torque monitoring techniques, the torque is a result of the total frictional force across the entire wafer surface; there is no spatial resolution for the measurement. Consequently, when underlying layer is beginning to be exposed in some regions of the substrate and the motor current signal begins to change, it is not possible to determine which portion of the substrate is being clearing first.

However, by applying pressure to the substrate in different zones at different frequencies, it may be possible obtain information from the motor current signal regarding the spatial distribution of friction on the substrate. This can enable determination of the distribution of clearing on the substrate.

Figure 1:
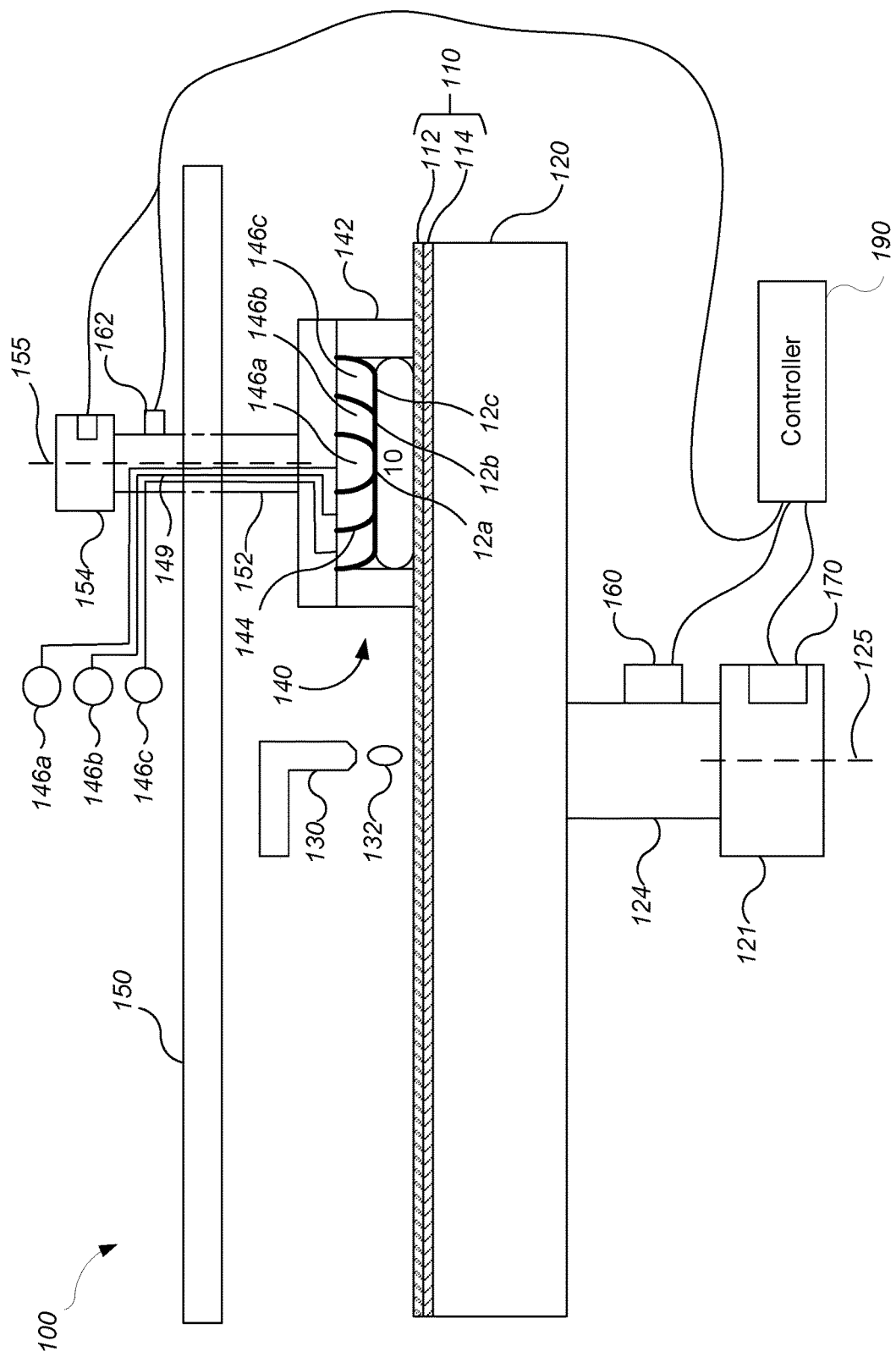
FIG. 1 illustrates a schematic cross-sectional view of an example of a polishing apparatus.
Figure 2:
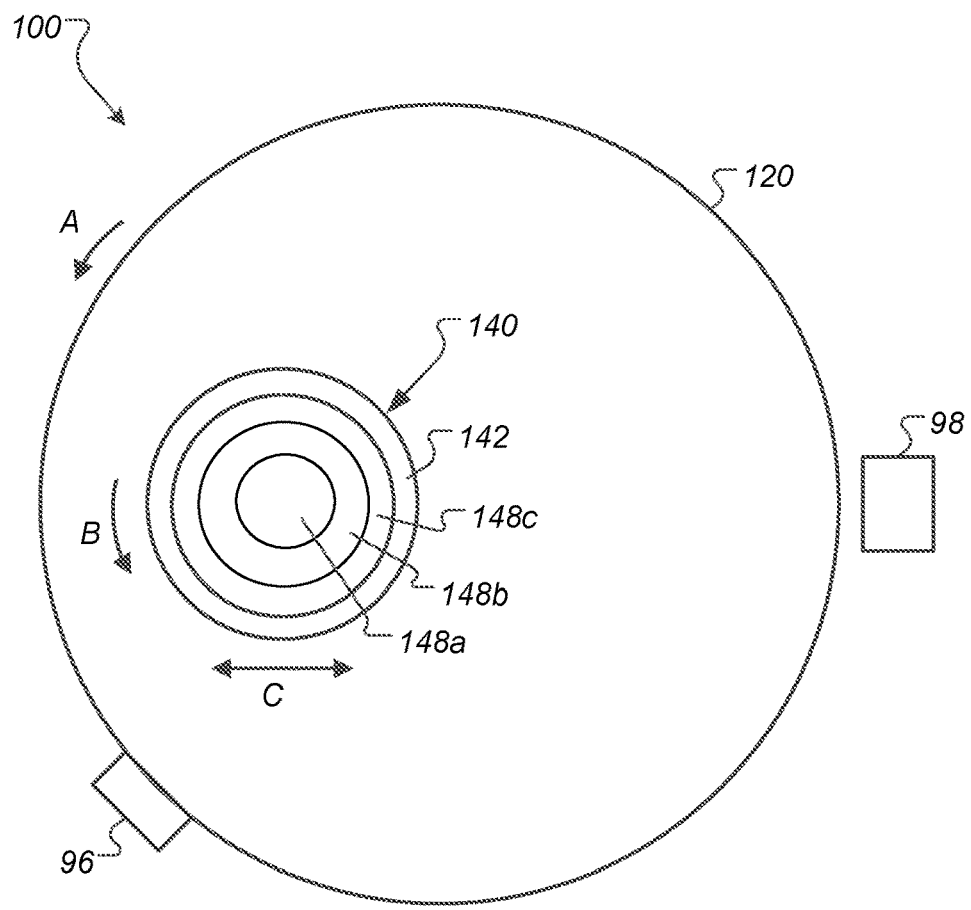
FIG. 2 illustrates a schematic top view of the polishing apparatus.

FIGS. 1-2 illustrate an example of a polishing apparatus 100. The polishing apparatus 100 includes a rotatable disk-shaped platen 120 on which a polishing pad 110 is situated. The polishing pad 110 can be a two-layer polishing pad with an outer polishing layer 112 and a softer backing layer 114. The platen is operable to rotate (arrow A in FIG. 2) about an axis 125. For example, a motor 121, e.g., a DC induction motor, can turn a drive shaft 124 to rotate the platen 120.

The polishing apparatus 100 can include a port 130 to dispense polishing liquid 132, such as abrasive slurry, onto the polishing pad 110 to the pad. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. Each carrier head 140 can have independent control of the polishing parameters, for example pressure, associated with each respective substrate.

The carrier head 140 is suspended from a support structure 150, e.g., a carousel, and is connected by a drive shaft 152 to a carrier head rotation motor 154, e.g., a DC induction motor, so that the carrier head can rotate about an axis 155 (arrow B in FIG. 2). Optionally each carrier head 140 can oscillate laterally (arrow C in FIG. 2), e.g., on sliders on the carousel 150, or by rotational oscillation of the carousel itself. In typical operation, the platen is rotated about its central axis 125, and each carrier head is rotated about its central axis 155 and translated laterally across the top surface of the polishing pad.

The carrier head 140 can include a retaining ring 142 to retain the substrate 10 below a flexible membrane 144. The carrier head 140 also includes one or more independently controllable pressurizable chambers defined by the membrane 144, e.g., three chambers 146a-146c, which can apply independently controllable pressures to associated zones on the flexible membrane 144 and thus on associated regions 12a-12c on the substrate 10 (see FIG. 3). Although only three chambers are illustrated in FIGS. 1-2 for ease of illustration, there could be two chambers, or four or more chambers, e.g., five chambers.

Figure 3:
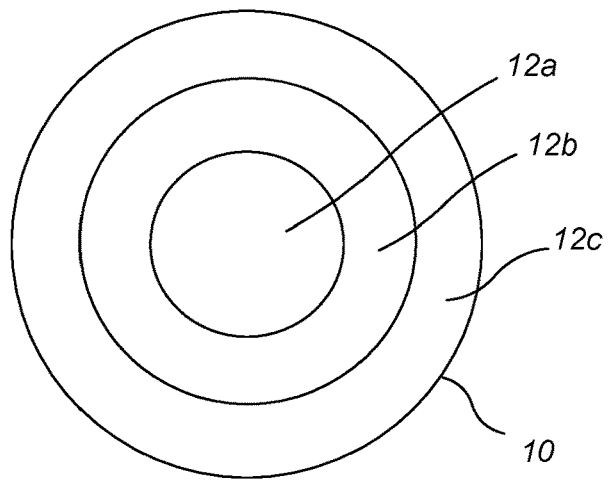
FIG. 3 illustrates a schematic bottom view of a substrate.

FIGS. 2 and 3 illustrate the chambers and regions as concentric, e.g., a circular central chamber 146a and annular concentric chambers 146b, 146c, which apply pressure to a circular central region 12a, and annular concentric regions 12b, 12c, respectively. However, other configurations are possible. For example, chambers could be distributed angularly around the central axis 155 of the carrier head 140. In addition, as noted above, there could be a different number of chambers and regions.

Pressure to the chambers 146a-146c can be controlled by pressure regulators 148a-148c. The pressure regulators 148a-148c can coupled through pneumatic lines 149 that pass through a rotary union and the drive shaft 152 to the respective chambers 146a-146c.

Alternatively, rather than pneumatic control of the pressure on the regions of the substrate, other actuators could be used, e.g., piezoelectric actuators.

A control system 190, such as a programmable computer, is connected to the motors 121, 154 to control the rotation rate of the platen 120 and carrier head 140. For example, each motor can include an encoder that measures the rotation rate of the associated drive shaft. A feedback control circuit, which could be in the motor itself, part of the controller, or a separate circuit, receives the measured rotation rate from the encoder and adjusts the current supplied to the motor to ensure that the rotation rate of the drive shaft matches at a rotation rate received from the controller.

The control system 190 is also connected to the pressure regulators 148a-148 to control pressure applied to the chambers 146a-146c in the carrier head 140.

The polishing apparatus also includes an in-situ monitoring system 160 which can be used to determine a polishing endpoint. The in-situ monitoring system 160 generates a signal that depends on friction between the substrate and polishing pad. In some implementations, the in-situ system provides a motor current or motor torque monitoring system. In this case, the in-situ monitoring system 160 includes a sensor to measure a motor torque. The measurement of motor torque can be a direct measurement of torque and/or a measurement of current supplied to a motor.

For example, a torque meter 160 can be placed on the drive shaft 124 and/or a torque meter 162 can be placed on the drive shaft 152. The output signal of the torque meter 160 and/or 162 is directed to the controller 190.

Alternatively or in addition, a current sensor 170 can monitor the current supplied to the motor 121 and/or a current sensor 172 can monitor the current supplied to the motor 154. The output signal of the current sensor 170 and/or 172 is directed to the control system 190. Although the current sensor is illustrated as part of the motor, the current sensor could be part of the controller (if the controller itself outputs the drive current for the motors) or a separate circuit.

Alternatively or in addition, the in-situ monitoring system can perform a more direct measure of frictional force. For example, the in-situ monitoring system can include a sensor to measure deflection of a flexure in the carrier head resulting from friction on the substrate and/or retaining ring.

The output of the sensor can be a digital electronic signal (if the output of the sensor is an analog signal then it can be converted to a digital signal by an ADC in the sensor or the controller). The digital signal is composed of a sequence of signal values, with the time period between signal values depending on the sampling frequency of the sensor. This sequence of signal values can be referred to as a signal-versus-time curve. The sequence of signal values can be expressed as a set of values $x_n$.

Figure 4A:
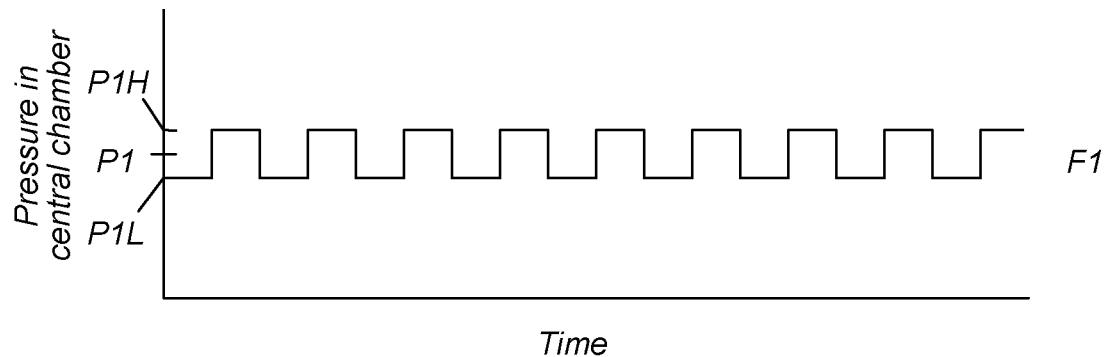
FIGS. 4A-4C illustrates graphs of pressure versus time for different chambers in the carrier head.
Figure 4B:
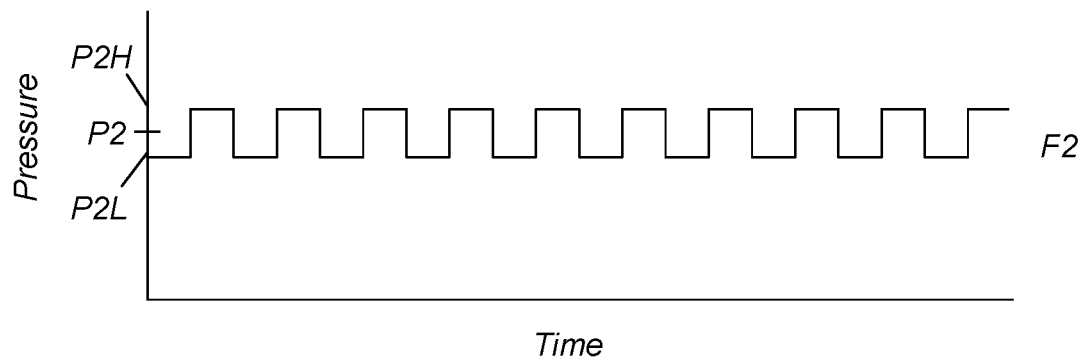
Figure 4C:
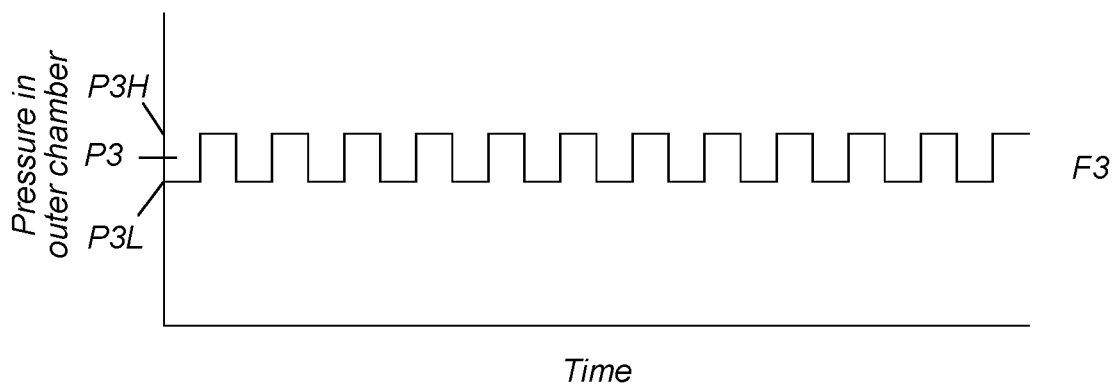

Referring to FIGS. 4A-4C, instead of each chamber applying a constant pressure to the associate region during polishing, each chamber applies a pressure that is modulated around a specified setpoint, e.g., a cyclic pressure. Each chamber of a multi-chamber carrier head will utilize a modulation function that is mutually orthogonal to the modulation functions of the other chambers. For example, each chamber can modulate the pressure at a different frequency from each of the other chambers. For a carrier head with N chambers, these frequencies can be labelled F1, F2, . . . FN. In some implementations, no frequency is an integer multiple of another frequency.

Each modulation function can be mutual orthogonal to other disturbances to the friction resulting from other components of the polishing system. For example, each frequency can also be different from some or all other frequencies in the chemical mechanical polishing system associated with moving parts during polishing, e.g., the head sweep frequency, pad conditioner sweep frequency, platen rotation rpm, or head rpm.

The modulating functions can be mutually orthogonal over an appropriately sized time period, e.g., ten to twenty seconds. One example of a mutually orthogonal modulating functions are sinusoidal functions with different frequencies. Other possible mutually orthogonal modulating functions include Legendre polynomials or various orthogonal wavelet bases such as the Haar wavelet.

The pressure applied to chamber 146a can be illustrated by FIG. 4A, the pressure applied to the middle chamber 146b can be illustrated by FIG. 4B, and the pressure applied to the outer chamber 146c can be illustrated by FIG. 4C. In this example, the pressure in the outer chamber 146c changes at the highest frequency F3, and the pressure in the central chamber 146a changes at the lowest frequency F1, but this is not required. The frequencies F1, . . . FN can each be between 1 Hz and 1 kHz, e.g., between 10 and 100 Hz.

Referring to FIG. 4A, if the nominal pressure to be applied to the central chamber 146a is P1, then the control system 190 can cause the pressure applied to the central chamber 146a to vary cyclically between a high pressure P1H and a low pressure P1L, such that the average pressure applied in the chamber 146a over a full cycle is P1. Similarly, the pressure applied to the middle chamber 146b can vary cyclically between a high pressure P2H and a low pressure P2L to provide an average pressure P2, and the pressure applied to the outer chamber 146c can vary cyclically between a high pressure P3H and a low pressure P3L to provide an average pressure P3.

Although FIGS. 4A-4C illustrate square wave signals, this is not required. The pressure to the chamber can be applied as a sinusoidal wave, sawtooth wave, etc. While different chambers can have the same pressure waveform (with different frequencies), it is also possible to apply different pressure waveforms to different chambers.

The pressure difference between the high pressure and low pressure, e.g., between P1H and P1L, should be large enough to be detectable in subsequent signal analysis, but otherwise as small as possible to limit fluctuations in polishing rate. For example, the difference between the high pressure and low pressure, e.g., P1H-P1L, can be 10-50%, e.g., 15-33%, of the average pressure, e.g., P1.

Figure 6:
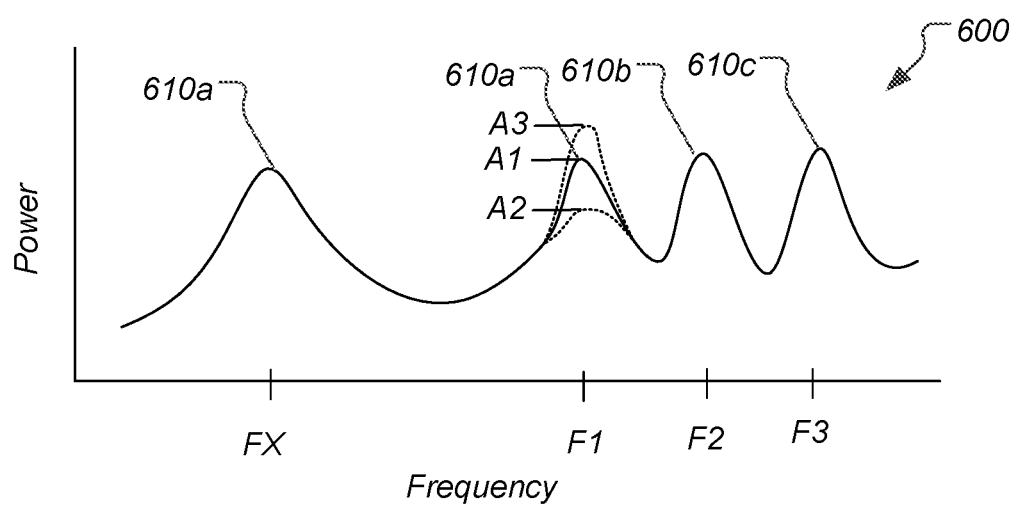
FIG. 6 illustrates a sample power spectrum.

The frictional variation associated with each zone's modulation can be determined by calculating the scalar projection of the signal values onto the modulating function. In the case where the mutually orthogonal functions are sinusoids, this projection can be performed via a discrete Fourier transform, e.g., a Fast Fourier Transform (FFT). The sequence of signal values, i.e., the motor torque measurements (whether directly or as motor current measurements) made during polishing are thus analyzed to determine the power corresponding to each of the frequencies F1, F2, . . . , FN. In the case of sinusoidal modulations, the power associated with each frequency can also be calculated by subjecting the signal to different bandpass filters where the passband is centered at the modulating frequency and then calculating the energy content of the output signal FIG. 6 illustrates a power spectrum 600 resulting from a Fourier transform of the sequence of signal values, with peaks 610a, 610b and 610c at frequencies F1, F2 and F3, respectively. The power spectrum 600 can also include peaks due to other cyclic behavior. For example, the peak 620 at frequency FX could correspond to the carrier head sweep frequency.

The relative magnitude of the peaks 610a, 610b, 610c in the power spectrum can be tracked over time to provide information regarding the amount of friction at each region 12a-12c on the substrate, and thus whether the underlying layer has been exposed in that region. In particular, a change in the peak amplitude (either absolute or relative to the other peaks) for a particular frequency can indicate exposure of the underlying layer in the region to which the pressure chamber applies the pressure waveform with the corresponding frequency. For example, if the peak 610a changes in amplitude, this can indicate that region 12a is being exposed.

For example, the underlying layer can have a lower coefficient of friction with the polishing pad than the overlying layer. In this case, when the underlying layer is exposed, the motor torque will drop. If the peak 610a undergoes falls in amplitude, e.g., from amplitude A1 to amplitude A2, while the other peaks 610b, 620c remain constant, this can indicate that the central region 12a is being exposed whereas the middle and outer regions 12b, 12c have not yet been exposed.

On the other hand, if the underlying layer has a higher coefficient of friction with the polishing pad than the overlying layer, then when the underlying layer is exposed the motor torque will increase. Again, if the peak 610a undergoes increases in amplitude, e.g., from amplitude A1 to amplitude A3, while the other peaks 610b, 620c remain constant, this can indicate that the central region 12a is being exposed whereas the middle and outer regions 12b, 12c have not yet been exposed.

Similar logic applies if peaks 610b or 620c change while other peaks remain constant. By evaluating the power spectrum over the course of polishing, and seeing which frequencies change and when, the control system 190 can determine when each zone clears to the underlying layer. For example, the control system 190 can determine whether the amplitude of the peak passes a threshold value, e.g., falls below a threshold value (if the underlying layer has a lower coefficient of friction than the overlying layer) or exceeds a threshold value (if the underlying layer has a higher coefficient of friction than the overlying layer). The threshold value can be a preset value determined empirically, or can be generated based on initial motor torque measurements, e.g., a change of at least a certain percentage, e.g., 10%, in the average power at the frequency over an initial period, e.g., 1-2 minutes of polishing.

Although FIG. 6 illustrates a power spectrum resulting from a Fourier transform, the technique can be generalized to performing scalar projection of the signal values onto the modulating function. The value resulting from the scalar projections can monitored to determine whether the value increase or decreases. For example, the control system 190 can determine whether the value passes a threshold value, e.g., falls below or exceeds, a threshold value.

In response to detecting that a particular zone on the substrate has cleared, the control system 190 can reduce pressure to the chamber. This can reduce dishing and erosion.

Figure 5:
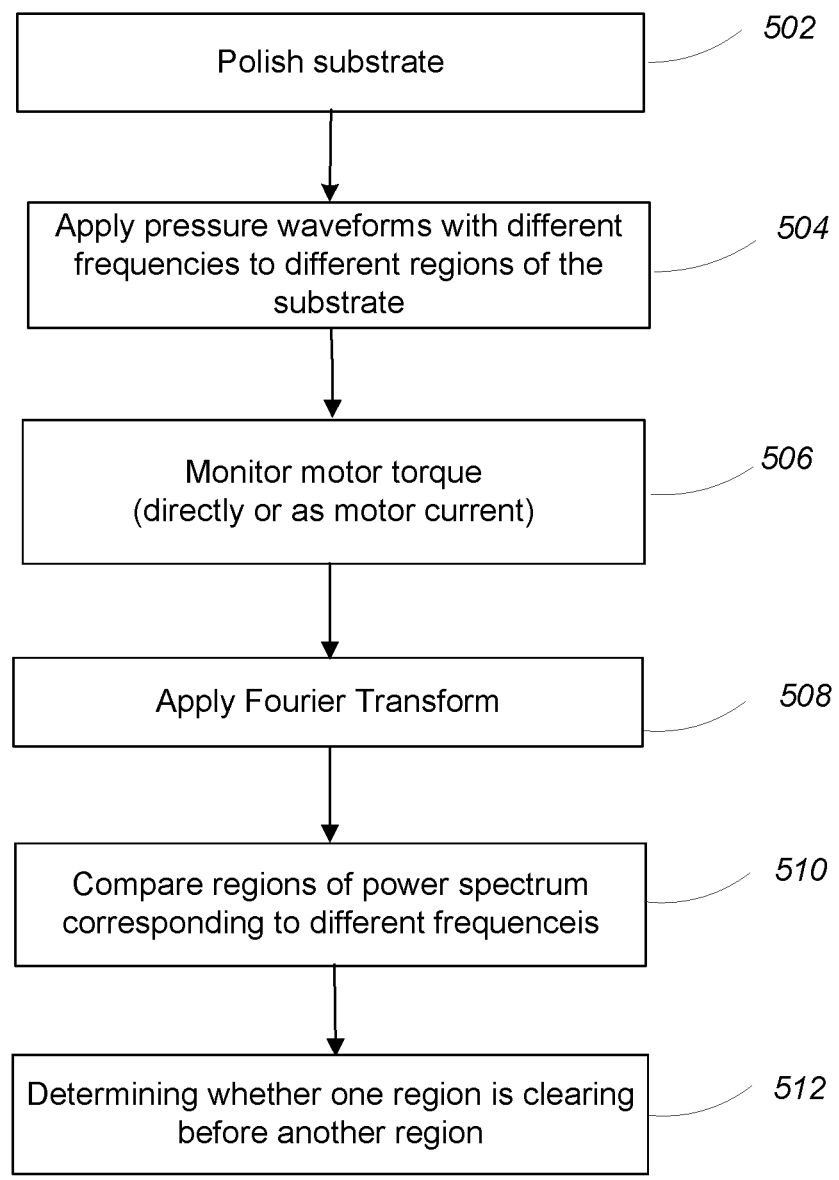
FIG. 5 illustrates a flow diagram of a method of processing a motor current signal.

The method performed is summarized in FIG. 5. During polishing (502), pressure waveforms with mutually orthogonal modulation functions, e.g., different frequencies, are applied by the carrier head to different regions of the substrate (504). The friction of the substrate against the pad, e.g., as a motor torque or a direct frictional measurement, is monitored (506), and the scalar projection of the friction measurement onto the modulation function is performed (508). For example, in the case of sinusoidal modulation at different frequencies, a power spectrum can be generated from the motor torque signal, e.g., by Fourier transform. The regions of the power spectrum corresponding to the different frequencies are compared (510), and the system can determine whether one region is clearing before another by detecting whether the power for one modulation changes relative to the power for another modulation (512). For example, again in the case of sinusoidal modulation at different frequencies, whether the power for one frequency changes relative to another frequency can be detected.

Implementations and all of the functional operations described in this specification, e.g., of the control system 190, can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The above described polishing apparatus and methods can be applied in a variety of polishing systems. Either the polishing pad, or the carrier head, or both can move to provide relative motion between the polishing surface and the wafer. The platen may orbit rather than rotate. The endpoint detection system may be applicable to linear polishing systems (e.g., where the polishing pad is a continuous or a reel-to-reel belt that moves linearly). The polishing layer can be a standard (for example, polyurethane with or without fillers) polishing material, a soft material, or a fixed-abrasive material. The method could be applied to other combinations of overlying and underlying materials, e.g., metal over dielectric, or dielectric over metal, etc.

Terms of relative positioning are used; it should be understood that the polishing surface and wafer can be held in a vertical orientation or some other orientations.

While this specification contains many specifics, these should not be construed as limitations on the scope of what may be claimed, but rather as descriptions of features that may be specific to particular embodiments of particular inventions.

What is claimed is:

1. A computer program product, comprising a non-transitory computer-readable medium having instructions to cause one or more computers to:
   cause a carrier head of a polishing system to apply a first pressure modulated by a first modulation function to a first region of a substrate during polishing of the substrate;
   cause the carrier head of the polishing system to apply a second pressure modulated by a second modulation function that is orthogonal to the first modulation function to a different second region of the substrate;
   receive a sequence of measured values from an in-situ friction monitoring system;
   determine a relative contribution to the sequence of measured value from the first region and second region based on distinguishing the first modulation function from the second modulation function;
   determine which of the first region or the second region an overlying layer is clearing first to expose an underlying layer; and
   adjust a polishing parameter based on which of the first region or the second region is clearing first.

2. The computer program product of claim 1, wherein the first modulation function comprises a first cyclic waveform having a first frequency and the second modulation function comprises a second cyclic waveform having a different second frequency.

3. The computer program product of claim 1, comprising storing one or more parameters indicating a relative coefficient of friction of the overlying layer and the underlying layer.

4. The computer program product of claim 3, wherein storing the one or more parameters comprises storing a single parameter indicating which of the overlying layer and the underlying layer has a higher coefficient of friction.

5. The computer program product of claim 3, wherein storing the one or more parameters comprises storing a first parameter indicating a coefficient of friction of the overlying layer and a second parameter indicating a coefficient of friction of the underlying layer.

6. The computer program product of claim 3, comprising instructions to determine a scalar projection of the sequence of measured values onto each of the first modulation function and the second modulation function to generate a first value and a second value.

7. The computer program product of claim 6, wherein the one or more parameters indicate that the underlying layer has a lower coefficient of friction, and comprising instructions to determine that the first region is clearing before the second region based on the first value decreasing relative to the second value.

8. The computer program product of claim 6, wherein the one or more parameters indicate that the underlying layer has a higher coefficient of friction, and comprising instructions to determine that the first region is clearing before the second region based on the first value increasing relative to the second value.

9. The computer program product of claim 6, wherein the one or more parameters indicate that the underlying layer has a lower coefficient of friction, and comprising instructions to determine that the second region is clearing before the first region based on the second value decreasing relative to the first value.

10. The computer program product of claim 6, wherein the one or more parameters indicate that the underlying layer has a higher coefficient of friction, and comprising instructions to determine that the second region is clearing before the first region based on the second value increasing relative to the first value.

11. The computer program product of claim 1, comprising instructions to receive a first nominal pressure and a second nominal pressure from a polishing recipe, and wherein an average of the first pressure modulated by the first modulation function equals the first nominal pressure and an average of the second pressure modulated by the second modulation function equals the second nominal pressure.

12. The computer program product of claim 11, comprising instructions to compute a first upper pressure value and a first lower pressure value based on the first nominal pressure and a second upper pressure value and a second lower pressure value based on the second nominal pressure.

* * * * *